United States Patent [19]

Hoffman

[11] Patent Number: 5,696,631
[45] Date of Patent: Dec. 9, 1997

[54] UNIT MAGNIFICATION PROJECTION LENS SYSTEM

[75] Inventor: Jeffrey M. Hoffman, White Plains, N.Y.

[73] Assignee: Anvik Corporation, Hawthorne, N.Y.

[21] Appl. No.: 605,426

[22] Filed: Feb. 22, 1996

[51] Int. Cl.$^6$ .................. G02B 3/00; G02B 13/22
[52] U.S. Cl. ........................... 359/649; 359/663
[58] Field of Search .................... 359/649, 650, 359/651, 663

[56] References Cited

U.S. PATENT DOCUMENTS

| | | | |
|---|---|---|---|
| 4,891,663 | 1/1990 | Hirose | 359/785 |
| 5,388,003 | 2/1995 | Naganuma et al. | 359/649 |

FOREIGN PATENT DOCUMENTS

| | | | |
|---|---|---|---|
| 5-323232 | 12/1993 | Japan | 359/663 |
| 1539717 | 1/1990 | U.S.S.R. | 359/649 |
| 1730605 | 4/1992 | U.S.S.R. | 359/649 |

Primary Examiner—David C. Nelms
Assistant Examiner—Jordan M. Schwartz
Attorney, Agent, or Firm—Carl C. Kling

[57] ABSTRACT

A unit magnification lens system suitable for imaging of features in photoresist designed for exposure at a wavelength of 248.4 nm using a krypton fluoride excimer laser. This lens system is characterized by a very long working distance in the object and image spaces to allow incorporation of minors in the imaging path. The optical system is refractive, telecentric, and symmetrical about the central aperture stop.

9 Claims, 4 Drawing Sheets

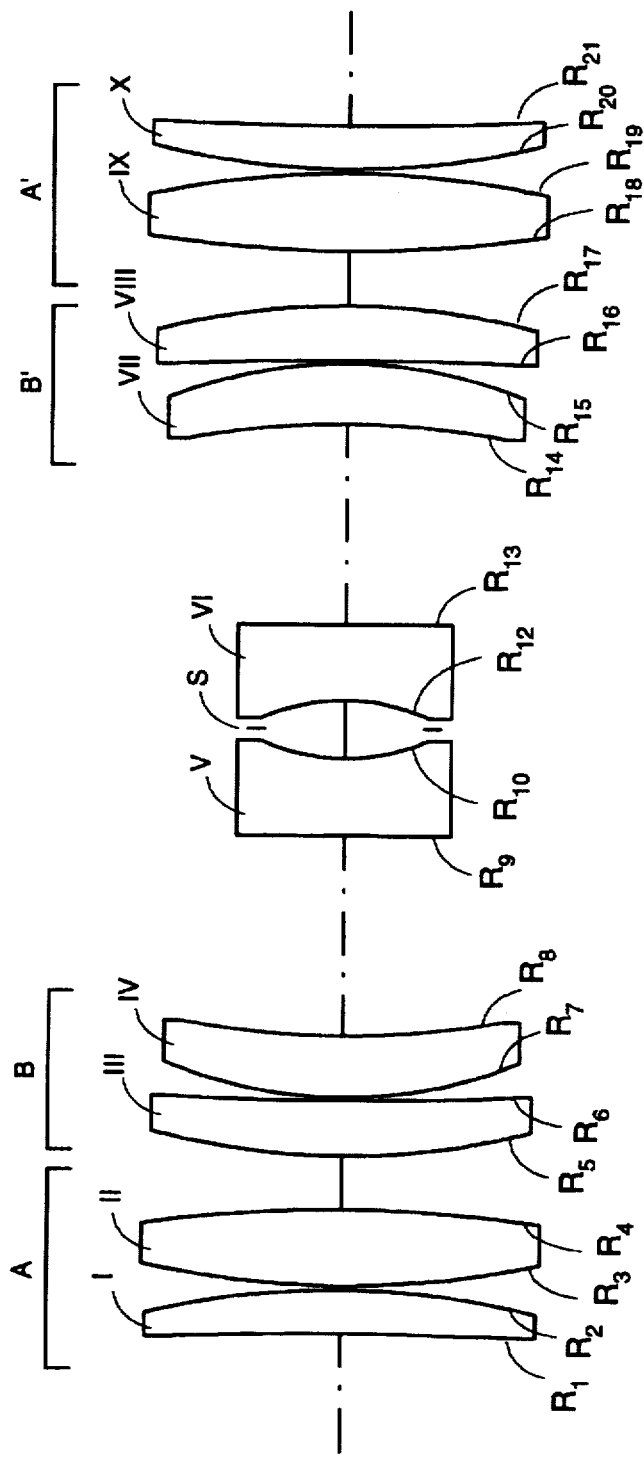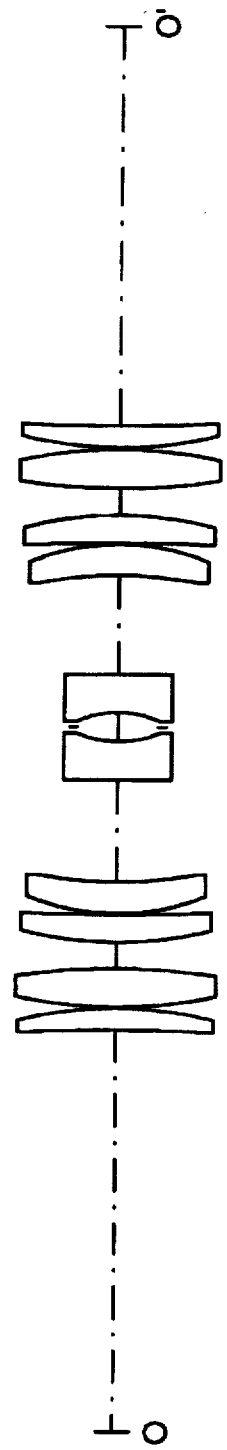
Fig. 1
Fig. 2

UNIT MAGNIFICATION PROJECTION LENS SYSTEM

FIELD OF THE INVENTION

This invention relates to projection lithography imaging systems for exposing substrates at high imaging resolution, and specifically relates to a projection lens for imaging an illuminated region of a mask onto a substrate at unit magnification with high resolution and providing a large working distance in object and image spaces.

BACKGROUND OF THE INVENTION

In many applications of projection lithography, a projection lens system with a magnification of unity is used to image features within an illuminated region of a mask onto a substrate. If the size of the illumination field is smaller than the area of features to be patterned onto the substrate, the entire region is typically exposed by suitably scanning or stepping the mask and substrate. Scanning large-area patterning systems that take advantage of projection at unit magnification have been described by K. Jain in U.S. Pat. Nos. 5,285,236 and 4,924,257. These systems are used for the manufacture of a variety of products, including integrated circuits on silicon wafers, flat-panel displays on glass substrates, and multi-chip modules and printed circuit boards on laminate substrates. In a pending application (Ser. No. 08/551,134), K. Jain and the present inventor have also described a large-area patterning system in which the imaging magnification is substantially unity, but means are provided for adjustment of the magnification from unity by a fraction of a percent to compensate for scale changes in the substrate resulting from processing.

For manufacture of electronic devices such as integrated circuits and flat panel displays, the projection lens must have very high resolving power. Because the resolution of a lens depends directly on the wavelength of illumination, higher imaging resolution may be achieved by using a very short wavelength. Illumination sources commonly used are mercury arc lamps and excimer lasers. Arc lamps produce a spectrum of radiation, with significant peaks at 436 and 365 nm. For higher resolution, excimer lasers are being increasingly used with a variety of gas media, most commonly krypton fluoride (KrF), xenon chloride (XeCl), and argon fluoride (ArF) emitting at ultraviolet wavelengths of 248, 308, and 193 nm, respectively.

The projection lens system must be designed for use at the exposure wavelength. For wavelengths below about 300 nm, there is a lack of suitable refractive materials. For very high resolution systems, the wavelength bandwidth of the radiation produced by an excimer laser is commonly narrowed using a variety of techniques to eliminate the need to produce an achromatic design. The most suitable material for such a monochromatic design is high-grade fused silica. In practice, to minimize reflections from the individual surfaces, the lens elements are coated with anti-reflection coatings designed for the exposure wavelength.

The majority of current projection lens systems are reduction lenses. These reduction lenses have very short working distances, especially on the substrate side. This presents difficulties in handling of the substrates, particularly by high-speed automated part loaders. Such lens systems are also extremely expensive, making the costs of high-resolution lithographic tools prohibitively high for production of low-priced devices. There is a need for refractive projection lens systems that have unit magnification and permit large working distances both on the substrate and mask sides. There is also a need for building such high performance lenses at low cost to enable cost-effective production of lithography systems. This invention describes such a projection lens system.

SUMMARY OF THE INVENTION

This invention describes a projection lens system for imaging features within an illuminated region of a mask onto a photo-sensitive substrate at unit magnification with high resolution.

An object of the invention is to provide a relatively low cost projection lens system with appropriate characteristics for use with an excimer laser source for exposure of photoresist.

Another object of the invention is to provide a very large working distance between the projection lens system and both the mask and substrate, to allow for incorporation of fold mirrors in both object and image spaces.

An advantage of the invention is that the projection lens system is symmetric about the aperture stop which assists in control over image aberrations and reduces manufacturing cost.

A feature of the projection lens system is that it is telecentric in object and image spaces, so that the system magnification is insensitive to focal plane shifts.

Other objects, features and advantages of the invention will be apparent to those skilled in the art from the following description of the invention and the attached drawings.

BRIEF DESCRIPTION OF THE DRAWINGS

FIG. 1 is a schematic illustration of a first example of the preferred embodiment of the projection lens system according to this invention.

FIG. 2 is a schematic illustration of the projection lens system shown in FIG. 1 which includes the object and image surfaces.

DETAILED DESCRIPTION OF THE EMBODIMENT

Figure 3:
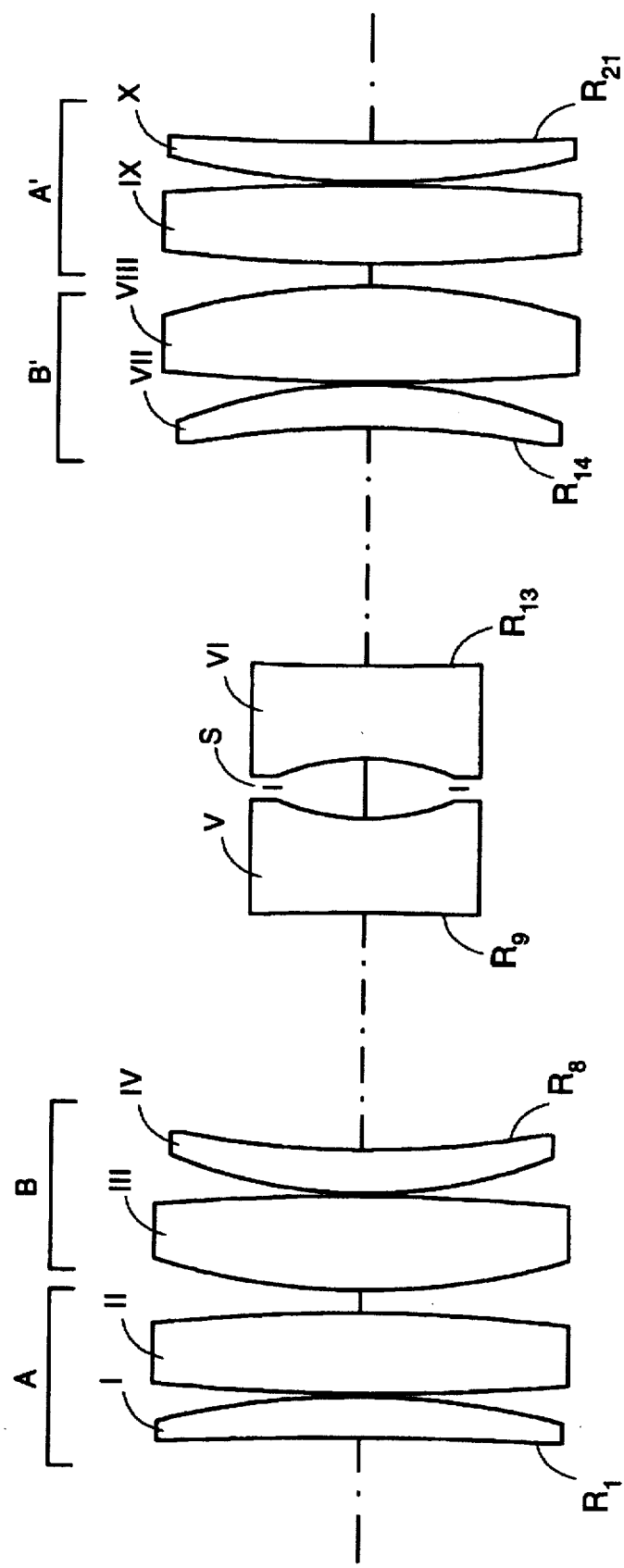
FIG. 3 is a schematic illustration of a second example of the preferred embodiment of the projection lens system according to this invention.

The projection lens system is refractive and comprised of fused silica components. It has been designed for use with a krypton fluoride excimer laser source operating at a wavelength of 248.4 nm. The excimer laser radiation is line-narrowed to provide a very small bandwidth about the central wavelength of 248.4 nm, allowing the use of high-grade fused silica for all components. Straightforward modifications to this embodiment may be made to allow for the use of any suitable narrowband ultraviolet laser source emitting at a wavelength in the vicinity of 248 nm.

When imaging at unit magnification, it is well known that a symmetric arrangement of lens elements about the central aperture stop will provide a condition in which the coma, distortion, and lateral chromatic aberration are corrected.

The coma, distortion, and lateral chromatic aberration contributions from the front half of the system are exactly balanced by the contributions from the rear half of the system. The projection lens system has been designed to be exactly symmetric to take advantage of this feature. The symmetry of the system and natural aberration balancing help in providing a low cost system with minimal complexity.

FIG. 1 presents a schematic view of the first of two examples (Example 1) of the preferred embodiment of the new projection lens system. The projection lens system is made up of ten elements (I to X) symmetrically arranged about a central aperture stop (S). The front half of the lens (Elements I to V) is identical to the rear half of the lens (Elements VI to X) but reversed in orientation, such that the front radius of curvature of Element 1, $R_1$, is identical to the back radius of curvature of Element X, $R_{21}$; the back radius of curvature of Element 1, $R_2$, is identical to the front radius of curvature of Element X, $R_{20}$; and so on. FIG. 2 shows a schematic of the new projection lens system that includes the object and image surfaces, O and O'.

From the object side to the image side, the projection lens system consists of four elements with positive refracting power (I to IV), followed by two elements with negative refracting power (V and VI), followed by four elements with positive refracting power (VII to X). The positive elements are arranged such that Elements I and II form Group A, Elements III and IV form Group B, and similarly, Elements IX and X form the corresponding group A', and Elements VII and VIII form the corresponding group, B'.

In Example 1, described in Table 1 below and depicted in FIGS. 1 and 2, the positive power of Elements I to IV is distributed such that Element II has the largest power. Element I has positive power and a meniscus shape facing the object plane. Element II has the largest positive contribution and is bi-convex. Elements III and IV are positive and have meniscus shapes facing the central aperture stop. Elements I, III, and IV have very similar refractive power, and Element II has significantly larger power than Elements I, III, and IV (about 70–80% larger in this example than Elements I, III, and IV). Also, the bundle of rays is largest on Element II which increases its contribution to the total system power. Elements I to IV are identical to the corresponding elements VII to X.

Element V is strongly negative and nearly plano-concave, in which the front surface is very weakly concave, and the rear surface is strongly concave toward the central aperture stop. Element VI is identical to Element V, but reversed such that the strongly concave surface of Element VI also faces the central aperture stop.

FIG. 3 presents a schematic view of the second of two examples (Example 2) of the preferred embodiment of the new projection lens system. In Example 2, described in Table 2 below, the positive power of Elements I to IV is distributed such that Elements III has the largest power. Element I has positive power and a meniscus shape facing the object plane. Element II is positive and bi-convex. Element III has the largest positive contribution and is bi-convex. Element IV is a positive meniscus facing the aperture stop. In this example, Elements I, II, and IV are similar in refractive power, and Element III is about 75–90% higher in refractive power. Elements I to IV are identical to the corresponding elements VII to X.

Similar to Example 1, Element V is strongly negative and nearly plano-concave, in which the front surface is weakly concave, and the rear surface is strongly concave toward the central aperture stop. Element V is identical to the corresponding element VI.

Figure 4:
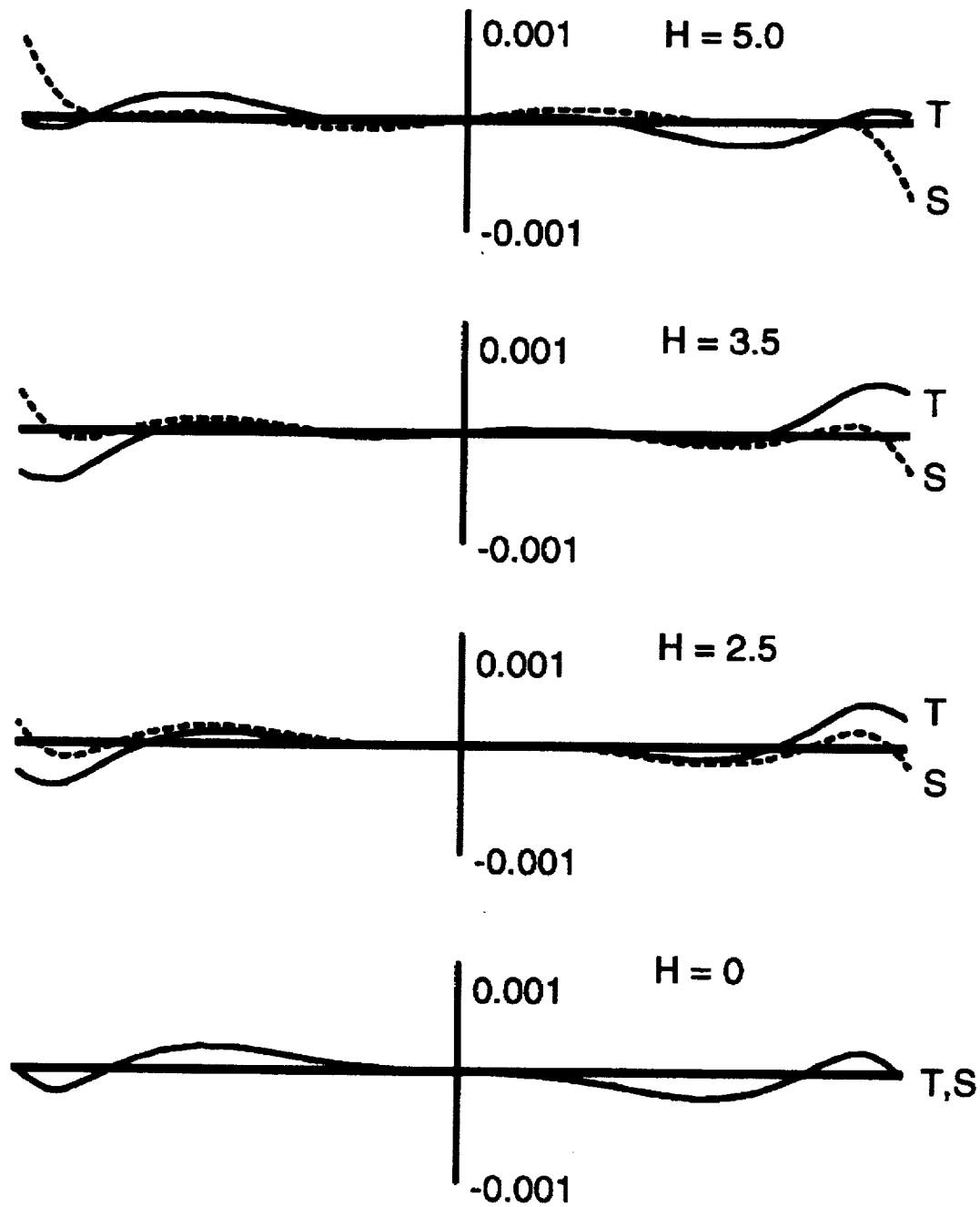
FIG. 4 depicts the transverse ray aberrations of the projection lens system shown in FIG. 1 as a function of tangential and sagittal pupil coordinates at four points across the image field.
Figure 5:
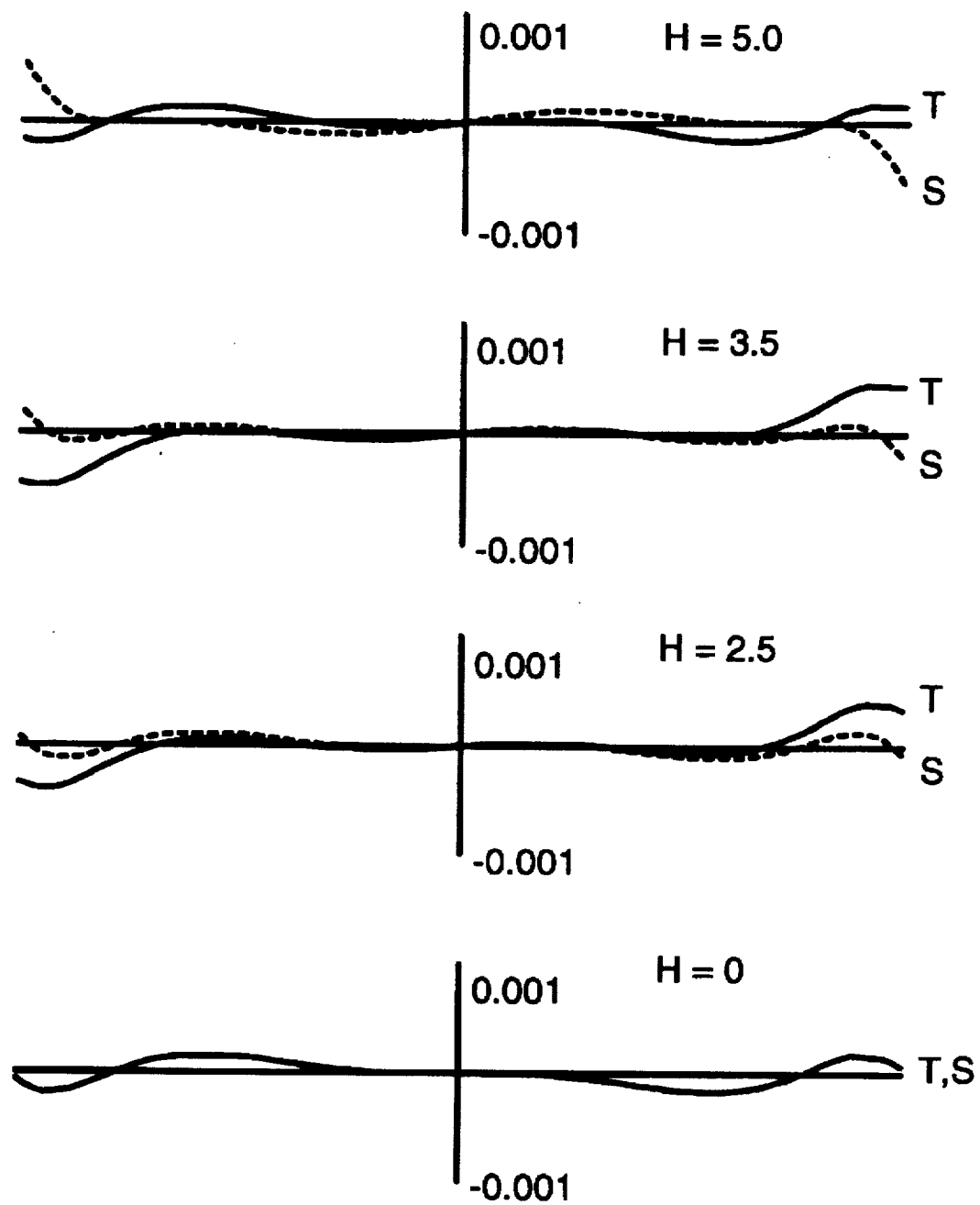
FIG. 5 depicts the transverse ray aberrations of the projection lens system shown in FIG. 3 as a function of tangential and sagittal pupil coordinates at four points across the image field.

The transverse ray aberrations of Example 1 as a function of tangential (T) and sagittal (S) coordinates in the pupil are given in FIG. 4 for image heights, H, of 0, 2.5, 3.5, and 5.0. The transverse ray aberrations for Example 2 are similarly given in FIG. 5. The two examples have almost identical performance, showing that the refractive power may be distributed such that either Element II or Element III (and the corresponding Elements IX and VIII) may have the largest power and aberration contribution of the group of positive components.

As mentioned earlier, the symmetric arrangement of elements gives a natural balance of coma, distortion, and lateral chromatic aberration at unit magnification. The components of these aberrations produced by the surfaces in front of the central aperture stop are exactly balanced by the contributions from the surfaces after the central aperture stop. In a symmetric arrangement, however, the spherical aberration and astigmatism produced by the surfaces before the central aperture stop will add to an identical amount of spherical aberration, astigmatism, and axial chromatic aberration produced by the surfaces after the central aperture stop. Thus, the spherical aberration, astigmatism, and axial color in each half of the lens must be separately balanced. In these examples, the spherical aberration, astigmatism, and axial color produced by the four positive elements I to IV nearly balance the spherical aberration, astigmatism, and axial color of opposite sign produced by Element V, and similarly, the aberration components from Elements VII to X balance the components from Element VI.

In both examples, Elements I and II are closely spaced to form Group A, and Elements III and IV are closely spaced to form Group B, and similarly, Elements IX and X are spaced to form the corresponding Prime group, A', and Elements VII and VIII are spaced to form the corresponding Prime group, B'. The best performance is achieved for a small spacings between the elements in each group, particularly Groups Prime Group A and A', although larger separations may be given to improve manufacturability.

The effective focal length of the group of elements, I to IV, is approximately equal and opposite to the effective focal length of Element V, which gives a nearly collimated beam between Elements V and VI. The aperture stop is located at the back focal plane of the front half of the lens and the front focal plane of the rear half of the lens, which gives a doubly telecentric condition. Telecentricity is advantageous because the magnification will not change for small amounts of defocus. This is particularly important in lithographic patterning applications where the image is produced in photoresist of a finite thickness.

Another key feature of this design is the very large working distance in the object and image spaces of the lens. The rear half of the design is similar to a reverse telephoto system in which the back focal length is significantly longer than the effective focal length. The bundle of rays in the space between Elements V and VI is nearly collimated. Element VI is strongly negative, causing the beam to diverge significantly. The large expansion of the bundle of rays before the positive group of elements (VII to X) results in a back focal length for the group of elements VI to X that is much larger than the effective focal length. Also, to maximize the working distance between the object or image surface and the front surface of the lens, the front and rear surfaces should be flat or convex towards the object or image. This will give the maximum volume of space between the conjugate planes and the lens for incorporation of fold mirrors. In this embodiment, it is necessary to make the front and rear surfaces very weakly concave towards the object and image, which helps in aberration balancing while nearly maximizing the working distance.

In the design of this lens, sensitivity of the design to tilt and centration errors resulting from fabrication and assembly was also reduced as much as possible without limiting performance by limiting the wavefront aberration produced by tilts of each surface.

In these examples, all elements are constructed with high-grade fused silica having an index of refraction of 1.508320 at a wavelength of 248.4 nm. The numerical aperture is 0.18. These lens examples are scaled to give object and image diameters of 10.0 and a working distance in object and image space of 125.

Positive values of the radius of curvature, R, of each surface indicate that the center of curvature of the surface is toward the rear of the lens and negative values indicate that the center of curvature is toward the front of the lens. In Tables 1 and 2, Surface 1 describes the surface facing the object, Surface 21 describes the surface facing the image, and Surface 11 describes the central aperture stop, S.

TABLE 1

Lens Parameters for Example 1

| Surface | Radius of Curvature | Thickness or Spacing | Glass |
| --- | --- | --- | --- |
| 1 | −621.447 | 6.800 | Fused Silica |
| 2 | −123.233 | 0.680 | |
| 3 | 142.712 | 12.000 | Fused Silica |
| 4 | −202.829 | 8.370 | |
| 5 | 115.747 | 8.490 | Fused Silica |
| 6 | 609.474 | 0.500 | |
| 7 | 70.825 | 9.660 | Fused Silica |
| 8 | 132.376 | 31.158 | |
| 9 | −3051.500 | 12.000 | Fused Silica |
| 10 | 31.279 | 4.565 | |
| 11 | — | 4.565 | |
| 12 | −31.279 | 12.000 | Fused Silica |
| 13 | 3051.500 | 31.158 | |
| 14 | −132.376 | 9.660 | Fused Silica |
| 15 | −70.825 | 0.500 | |
| 16 | −609.474 | 8.490 | Fused Silica |
| 17 | −115.747 | 8.370 | |
| 18 | 202.829 | 12.000 | Fused Silica |
| 19 | −142.712 | 0.680 | |
| 20 | 123.233 | 6.800 | Fused Silica |
| 21 | 621.447 | | |

TABLE 2

Lens Parameters for Example 2

| Surface | Radius of Curvature | Thickness or Spacing | Glass |
| --- | --- | --- | --- |
| 1 | −607.544 | 6.000 | Fused Silica |
| 2 | −122.166 | 0.500 | |
| 3 | 359.370 | 11.752 | Fused Silica |
| 4 | −267.589 | 3.400 | |
| 5 | 105.008 | 14.000 | Fused Silica |
| 6 | −351.306 | 0.500 | |
| 7 | 73.423 | 6.469 | Fused Silica |
| 8 | 147.734 | 35.243 | |
| 9 | −532.703 | 13.874 | Fused Silica |
| 10 | 32.569 | 4.500 | |
| 11 | — | 4.500 | |
| 12 | −32.569 | 13.874 | Fused Silica |
| 13 | 532.703 | 35.243 | |

TABLE 2-continued

Lens Parameters for Example 2

| Surface | Radius of Curvature | Thickness or Spacing | Glass |
| --- | --- | --- | --- |
| 14 | −147.734 | 6.469 | Fused Silica |
| 15 | −73.423 | 0.500 | |
| 16 | 351.306 | 14.000 | Fused Silica |
| 17 | −105.008 | 3.400 | |
| 18 | 267.589 | 11.752 | Fused Silica |
| 19 | −359.370 | 0.500 | |
| 20 | 122.166 | 6.000 | Fused Silica |
| 21 | 607.544 | | |

I claim:

1. A projection lens system, having an object plane and an image plane, for imaging a pattern region of a mask onto a photo-sensitive substrate, having multiple lens elements configured to accept illumination from a narrowband ultraviolet laser source, so that said projection lens system provides unit magnification with a combination of high resolution and long working distance; characterized by:

a) a central aperture stop;

b) a front arrangement of lens elements; and c) a rear arrangement of lens elements;

said front arrangement of lens elements comprising, in sequence from the object plane of said projection lens system toward said central aperture stop, a first group and a second group of lens elements, in which groups each lens element has positive refracting power, and further comprising at least one final lens element with negative refracting power;

said rear arrangement of lens elements comprising an arrangement of lens elements identical to said front arrangement but oriented symmetrically with respect to said central aperture stop; and said first group of lens elements in said front arrangement comprising, in the order of location from the object to said central aperture stop, a first positive element with a front surface weakly concave towards the object, and further comprising a positive bi-convex second element; and said rear arrangement of lens elements including a rear group of lens elements oriented symmetrically to said first group of lens elements has a lens element comprising an identical weakly concave surface towards the image, and further comprises a bi-convex second element.

2. A projection lens system, having an object plane and an image plane, for imaging a pattern region of a mask onto a photo-sensitive substrate, having multiple lens elements configured to accept illumination from a narrowband ultraviolet laser source, so that said projection lens system provides unit magnification with a combination of high resolution and long working distance; characterized by:

a) a central aperture stop;

b) a front arrangement of lens elements; and c) a rear arrangement of lens elements;

said front arrangement of lens elements comprising, in sequence from the object plane of said projection lens system toward said central aperture stop, a first group and a second group of lens elements, in which groups each lens element has positive refracting power, and further comprising at least one final lens element with negative refracting power;

said rear arrangement of lens elements comprising an arrangement of lens elements identical to said front arrangement but oriented symmetrically with respect to said central aperture stop; and said second group of lens elements in said front arrangement comprising, in the order of location from the object to said central aperture stop, a first positive bi-convex element and further comprising a second positive element with a rear surface that is concave towards said central aperture stop; and said rear arrangement of lens elements including a rear group of lens elements oriented symmetrically to said second group of lens elements has a lens element comprising a surface that is concave towards said central aperture stop, and further comprises a bi-convex second element.

3. A projection lens system for imaging a region of a mask onto a photo-sensitive substrate, characterized by:

a) multiple lens elements configured to accept illumination from a narrowband ultraviolet laser source, so that said projection lens system provides unit magnification with a combination of high resolution and long working distance;

b) a central aperture stop about which said projection lens system is symmetric;

said multiple lens elements comprising a front arrangement of lens elements in front of said central aperture stop and a rear arrangement of lens elements behind said central aperture stop, said rear arrangement being identical to said front arrangement but oriented symmetrically about said central aperture stop;

said front arrangement of lens elements comprising, in the order from the object of said projection lens system to the central aperture stop, a plurality of front groups of lens elements with positive refracting power followed by at least one front lens element with negative refracting power; and said rear arrangement of lens elements comprising, in the order from the central aperture stop to the image plane of said projection lens system, at least one rear lens element with negative refracting power, followed by a plurality of rear groups of lens elements with positive refracting power;

and in which the radii of curvature, glass thicknesses and air spacings are substantially as given in the following table:

| Surface | Radius of Curvature | Thickness or Spacing | Glass |
|---|---|---|---|
| 1 | −621.447 | 6.800 | Fused Silica |
| 2 | −123.233 | 0.680 | |
| 3 | 142.712 | 12.000 | Fused Silica |
| 4 | −202.829 | 8.370 | |
| 5 | 115.747 | 8.490 | Fused Silica |
| 6 | 609.474 | 0.500 | |
| 7 | 70.825 | 9.660 | Fused Silica |
| 8 | 132.376 | 31.158 | |
| 9 | −3051.500 | 12.000 | Fused Silica |
| 10 | 31.279 | 4.565 | |
| 11 | — | 4.565 | |
| 12 | −31.279 | 12.000 | Fused Silica |
| 13 | 3051.500 | 31.158 | |
| 14 | −132.376 | 9.660 | Fused Silica |
| 15 | −70.825 | 0.500 | |
| 16 | −609.474 | 8.490 | Fused Silica |
| 17 | −115.747 | 8.370 | |

-continued

| Surface | Radius of Curvature | Thickness or Spacing | Glass |
|---|---|---|---|
| 18 | 202.829 | 12.000 | Fused Silica |
| 19 | −142.712 | 0.680 | |
| 20 | 123.233 | 6.800 | Fused Silica |
| 21 | 621.447. | | |

4. A projection lens system for imaging a region of a mask onto a photo-sensitive substrate, characterized by:

a) multiple lens elements configured to accept illumination from a narrowband ultraviolet laser source, so that said projection lens system provides unit magnification with a combination of high resolution and long working distance;

b) a central aperture stop about which said projection lens system is symmetric;

said multiple lens elements comprising a front arrangement of lens elements in front of said central aperture stop and a rear arrangement of lens elements behind said central aperture stop, said rear arrangement being identical to said front arrangement but oriented symmetrically about said central aperture stop;

said front arrangement of lens elements comprising, in the order from the object of said projection lens system to the central aperture stop, a plurality of front groups of lens elements with positive refracting power followed by at least one front lens element with negative refracting power; and said rear arrangement of lens elements comprising, in the order from the central aperture stop to the image plane of said projection lens system, at least one rear lens element with negative refracting power, followed by a plurality of rear groups of lens elements with positive refracting power;

and in which the radii of curvature, glass thicknesses and air spacings are substantially as given in the following table:

| Surface | Radius of Curvature | Thickness or Spacing | Glass |
|---|---|---|---|
| 1 | −607.544 | 6.000 | Fused Silica |
| 2 | −122.166 | 0.500 | |
| 3 | 359.370 | 11.752 | Fused Silica |
| 4 | −267.589 | 3.400 | |
| 5 | 105.008 | 14.000 | Fused Silica |
| 6 | −351.306 | 0.500 | |
| 7 | 73.423 | 6.469 | Fused Silica |
| 8 | 147.734 | 35.243 | |
| 9 | −532.703 | 13.874 | Fused Silica |
| 10 | 32.569 | 4.500 | |
| 11 | — | 4.500 | |
| 12 | −32.569 | 13.874 | Fused Silica |
| 13 | 532.703 | 35.243 | |
| 14 | −147.734 | 6.469 | Fused Silica |
| 15 | −73.423 | 0.500 | |
| 16 | 351.306 | 14.000 | Fused Silica |
| 17 | −105.008 | 3.400 | |
| 18 | 267.589 | 11.752 | Fused Silica |
| 19 | −359.370 | 0.500 | |
| 20 | 122.166 | 6.000 | Fused Silica |
| 21 | 607.544. | | |

5. A projection lens system, having an image plane and an object plane, and being symmetric about a central aperture stop, for use in imaging a pattern of a mask onto a photo-sensitive substrate, configured to accept illumination from a narrowband ultraviolet laser source, so as to provide unit magnification with a combination of high resolution and long working distance, characterized by: a front arrangement of lens elements, positioned in front of said central aperture stop and a rear arrangement of lens elements positioned in back of said central aperture stop, said rear arrangement being identical to said front arrangement but oriented oppositely, said front arrangement of lens elements comprising, in sequence from the object plane of said projection lens system toward the central aperture stop, a plurality of groups of lens elements, each lens element in said plurality of groups having positive refracting power, followed by at least one lens element with strong negative refracting power, providing essentially collimated light through said central aperture stop to said rear arrangement of lens elements; and said rear arrangement of lens elements being identical to said front arrangement but oriented symmetrically about said central aperture stop further characterized in that said groups of positive lens elements in said front arrangement, and said symmetrical groups of positive lens elements in said rear arrangement, have respective object side and image side lens element surfaces very weakly concave facing respectively toward the object plane and image plane, so as to have large working spaces for other elements of the overall system while substantially minimizing aberrations; and said projection lens system is substantially telecentric in both object space and image space.

6. A projection lens system according to claim 5, further characterized by:

said narrowband laser source being a krypton fluoride excimer laser operating at a wavelength in the vicinity of 248.4 nm and with a bandwidth narrowed so that variations in aberrations of said lens elements will be within the resolution requirements of the projection lens system, to eliminate the need for achromatization of the projection lens system.

7. A projection lens system according to claim 5, further characterized in that all of said lens elements are constructed of high-grade fused silica, transmissive to the wavelength of the ultraviolet laser source.

8. A projection lens system for imaging a region of a mask onto a photo-sensitive substrate, according to claim 5, further characterized by:

at least one fold mirror between the object plane and the front arrangement of lens elements; and at least one fold mirror between the image plane and the rear arrangement of lens elements; further characterized in providing a large working distance between the projection lens system and its related mask and substrate, for incorporation of said front arrangement fold mirror and said rear arrangement fold mirror respectively in object and image space.

9. A projection lens system for imaging a region of a mask onto a photo-sensitive substrate, according to claim 5, further characterized in that said front arrangement lens element closest to said central aperture stop, and said rear arrangement lens element closest to said central aperture stop, are both closely spaced to said central aperture stop and have strongly concave surfaces, facing said aperture stop, which have strong radii of curvature facing said central aperture stop and weak radii of curvature of their opposite surfaces, so as to produce nearly collimated light across said central aperture stop.

* * * * *